United States Patent [19]

Masuda et al.

[11] Patent Number: 4,697,110
[45] Date of Patent: Sep. 29, 1987

[54] FLUCTUATION-FREE INPUT BUFFER

[75] Inventors: Noboru Masuda; Michio Asano; Takehisa Hayashi, all of Kokubunji; Hirotoshi Tanaka, Hachioji; Akira Masaki, Tokyo, all of Japan

[73] Assignee: Hitachi, Ltd., Tokyo, Japan

[21] Appl. No.: 555,618

[22] Filed: Nov. 28, 1983

[51] Int. Cl.[4] .................... H03K 17/14; H03K 19/094
[52] U.S. Cl. .................................. 307/475; 307/443; 307/448; 307/450; 307/297
[58] Field of Search ............... 307/443, 446, 448, 450, 307/491, 297, 475

[56] References Cited

U.S. PATENT DOCUMENTS

| | | | |
|---|---|---|---|
| 3,299,291 | 1/1967 | Warner, Jr. et al. | 307/448 |
| 4,023,050 | 5/1977 | Fox et al. | 307/475 X |
| 4,242,604 | 12/1980 | Smith | 307/290 X |
| 4,393,315 | 7/1983 | Stickel et al. | 307/475 X |
| 4,453,095 | 6/1984 | Wrathall | 307/475 |
| 4,496,856 | 1/1985 | Ransom et al. | 307/455 X |
| 4,558,235 | 12/1985 | White et al. | 307/443 X |
| 4,563,601 | 1/1986 | Asano et al. | 307/475 |

FOREIGN PATENT DOCUMENTS 50743  4/1980  Japan ................................. 307/475

OTHER PUBLICATIONS

Van Tuyl et al., "High-Speed Integrated Logic with GaAs MESFET's", *IEEE-JSSC*; vol. SC.-9, No. 5, pp. 269-276; 10/1974.
Richman, "Characteristics and Operation of MOS Field-Effect Devices", pp. 114-118; *McGraw-Hill Book Co.*; 1967.
Hoffman, "Positive Voltage Translation Circuit"; *IBM TDB*; vol. 17, No. 8, pp. 2392-2393; 1/1975.

*Primary Examiner*—Stanley D. Miller
*Assistant Examiner*—D. R. Hudspeth
*Attorney, Agent, or Firm*—Antonelli, Terry & Wands

[57] ABSTRACT

An input buffer for a semiconductor circuit is provided with a source follower circuit composed of a first FET whose gate electrode has an input connected thereto, and a second FET of the same conductivity type as that of the first FET, whose drain electrode is connected to a source electrode of the first FET directly or through at least one level-shifting diode and whose gate electrode is supplied with a control voltage. The input buffer also includes a FET inverter circuit connected to the drain electrode of the second FET directly or through at least one level-shifting diode. An output signal for the input buffer is derived from the FET inverter circuit. A particular advantage of the present invention is that it permits the input buffer to switch its output from one level to another in response to input signals falling within a predetermined voltage range regardless of logic threshold level fluctuations in the FETs and fluctuations in supply voltages coupled to the input buffer.

14 Claims, 18 Drawing Figures

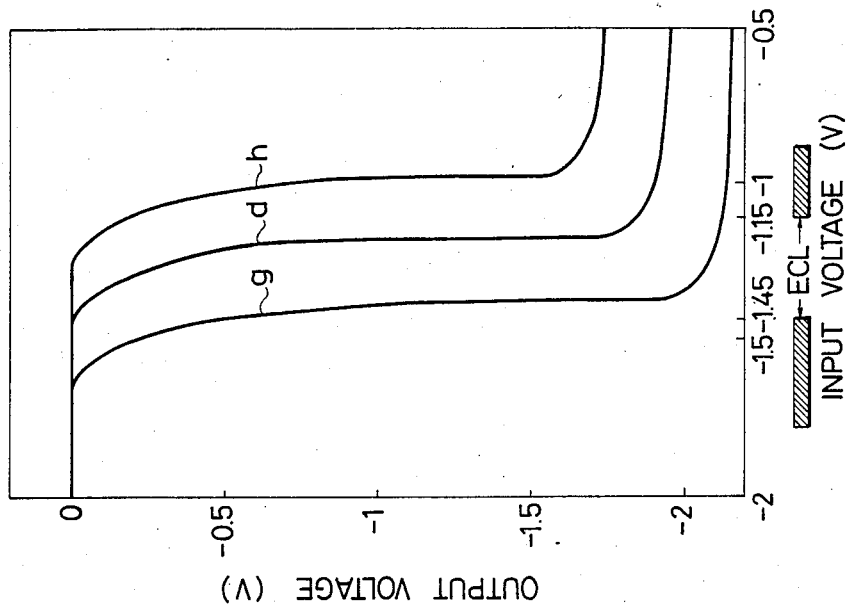
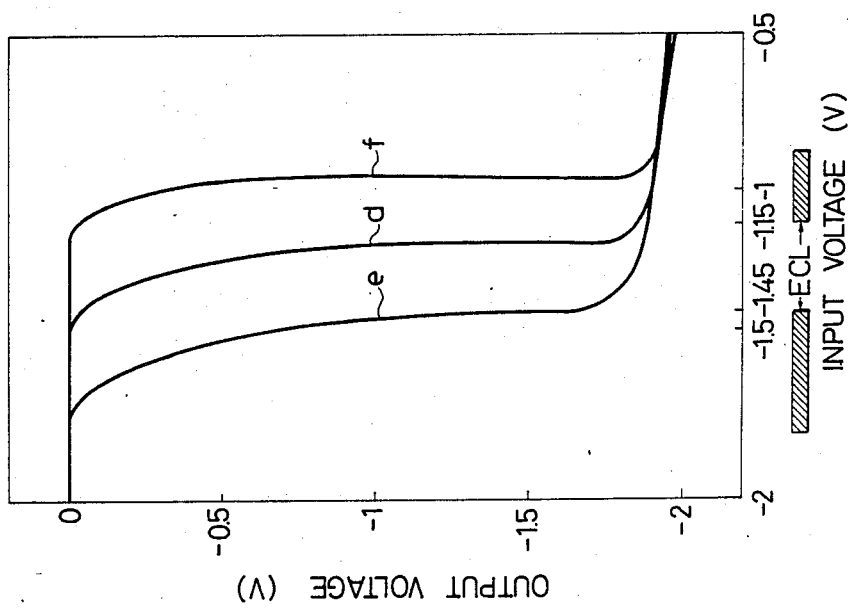

FLUCTUATION-FREE INPUT BUFFER

CROSS REFERENCE TO THE RELATED APPLICATION

This application relates to U.S. Application Ser. No. 629,763 filed on Sept. 6, 1983, now U.S. Pat. No. 4,563,601, issued Jan. 7, 1986, entitled "LEVEL CONVERSION INPUT CIRCUIT" filed by Michio Asano and Akira Masaki, and assigned to the present assignee, based on Japanese Patent Application No. 57-153901 filed Sept. 6, 1982.

BACKGROUND OF THE INVENTION

The present invention relates to input buffers, and more particularly to an input buffer for a digital integrated circuit of FETs which can receive ECL level signals.

As the input buffer of a digital integrated circuit constructed of FETs (field effect transistors), a circuit as shown in FIG. 1 has heretofore been employed by way of example.

This circuit consists of an inverter which is composed of normally "on" type FETs $Q_3$ and $Q_4$, and a level shifting circuit which is composed of diodes D and a resistor R. The level shifting circuit shifts an input level $V_{in}$ thereby to convert it into a voltage level capable of switching the inverter of the succeeding stage, that is, a transition logic level.

FIG. 2 is a graph of transfer characteristics in FIG. 1 in which a, b and c indicate the curves in the cases where the ratio $W_4/W_3$ between the gate widths of the FETs $Q_3$ and $Q_4$ is set at 5, 13 and 50, respectively. In this figure, a case is illustrated where a supply voltage $V_{SS}$ is set at $-2$ V, the threshold voltage $V_T$ of the FET at $-1$ V and the level shift magnitude $V_S$ of of the diodes D at 1.55 V.

As illustrated in FIG. 2, with the input buffer of FIG. 1, an input logic swing required for completely switching the output becomes smaller as the ratio between the gate width $W_4$ of the FET $Q_4$ and that $W_3$ of the FET $Q_3$ becomes greater. Here, assuming that the input signal is of an ECL (Emitter Coupled Logic) level, the output of the inverter needs to be completely switched in a range of signal levels from $-1.45$ V to $-1.15$ V. It is seen from FIG. 2 that $W_4/W_3$ needs to be at least 13 (i.e. curve b) in order to satisfy the above specification.

In this regard, the input buffer of FIG. 1 has the following two disadvantages:

(1) In a case where the threshold voltage $V_T$ of the FETs has fluctuated from the desired design level due to dispersions in manufacturing conditions etc., the input logic swing necessary for reliably switching the output increases.

(2) Also in a case where the supply voltage $V_{SS}$ has fluctuated, the input logic swing necessary for reliably switching the output increases.

FIG. 3 is a graph of transfer characteristics in the case where the threshold voltage $V_T$ has fluctuated in the circuit of FIG. 1, while FIG. 4 is a graph of transfer characteristics in the case where the supply voltage $V_{SS}$ has fluctuated in the same. In FIGS. 3 and 4, a curve d indicates the transfer characteristic obtained for design values of a threshold voltage $V_T = -1$ V and a supply voltage $V_{SS} = -2$ V in the case of $W_4/W_3 = 13$, and it is the same curve as that b in FIG. 2. Curves e and f in FIG. 3 indicate the transfer characteristics obtained when the supply voltage $V_{SS}$ is at a design value ($V_{SS} = -2$ V) and the threshold voltage $V_T$ has become $-1.3$ V and $-0.7$ V, respectively. Curves g and h in FIG. 4 indicate the transfer characteristics obtained when the threshold voltage $V_T$ is at a design value ($V_T = -1$ V) and the supply voltage $V_{SS}$ has become $-2.2$ V and $-1.8$ V, respectively. In any case, the input necessary for reliably switching the output is about $-1.6$ V as a low level and about $-0.9$ V as a high level, that is, the logic swing becomes about 0.7 V.

This value is approximately double the input logic swing 0.3 V requirement which the FIG. 1 circuit was originally designed to meet in the absence of any fluctuation, and this becomes a serious problem in practical circuit operation. The value of 0.7 V corresponds to the addition of about 0.4 V to the required 0.3 V logic swing range. This 0.4 V addition is the width of the change of the input logic threshold value of the inverter, the change being attributed to the fluctuation of the threshold voltage $V_T$ or the supply voltage $V_{SS}$. In a case where the fluctuations of the threshold voltage $V_T$ and the supply voltage $V_{SS}$ have simultaneously occurred, an additional 0.4 V is added to the logic swing required for complete switching. Therefore, the input logic swing becomes 1.1 V. When the gate width ratio $W_4/W_3$ is set to be smaller, the influence of the fluctuation of the threshold voltage $V_T$ can be somewhat mitigated. However, even in this case, the input logic swing originally required increases as stated before. It can accordingly be said that, in the presence of manufacturing dispersions or supply voltage fluctuation, a signal of the ECL level cannot satisfactorily be received and operated on by the circuit of FIG. 1.

Although the case of using the normally "on" type FETs has thus far been described, a similar problem arises in a circuit employing normally "off" type FETs.

SUMMARY OF THE INVENTION

The object of the present invention is to solve the above described problems found in prior art input buffers, and, in particular, to provide an input buffer whose buffer output signal is less affected by a manufacturing dispersion or a supply voltage fluctuation than such prior art input buffers. Further, it is an object of the present invention to accomplish this without substantial increases in power consumption or delay time.

The input buffer of the present invention is characterized by including a source follower circuit which is composed of first and second FETs of the same conductivity type connected in series and in which the gate of the first FET is connected to a circuit input for receiving an input signal, and a FET inverter circuit which receives an output signal from the source follower circuit, the logic threshold value of the source follower circuit being controlled by a voltage fed to the gate of the second FET in the source follower circuit. The present input buffer has an important feature that fluctuations of the input logic threshold value of the inverter, which is the problem of the prior-art circuit, is absorbed by the source follower circuit, so the output can be switched with only an input logic swing originally required by the circuit design for operation without such fluctuations.

BRIEF DESCRIPTION OF THE DRAWINGS

FIGS. 2, 3 and 4 are graphs of the transfer characteristics of the circuit in FIG. 1;

DESCRIPTION OF THE PREFERRED EMBODIMENTS

Figure 5:
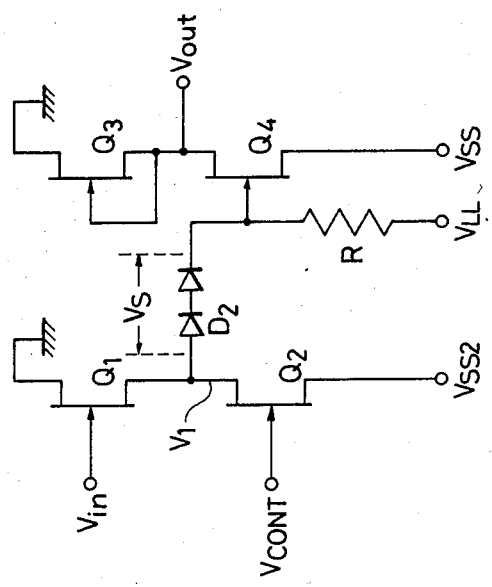
FIG. 5 is an arrangement diagram showing an embodiment of an input buffer according to the present invention.

FIG. 5 is an arrangement diagram of an input buffer showing an embodiment of the present invention.

Figure 2:
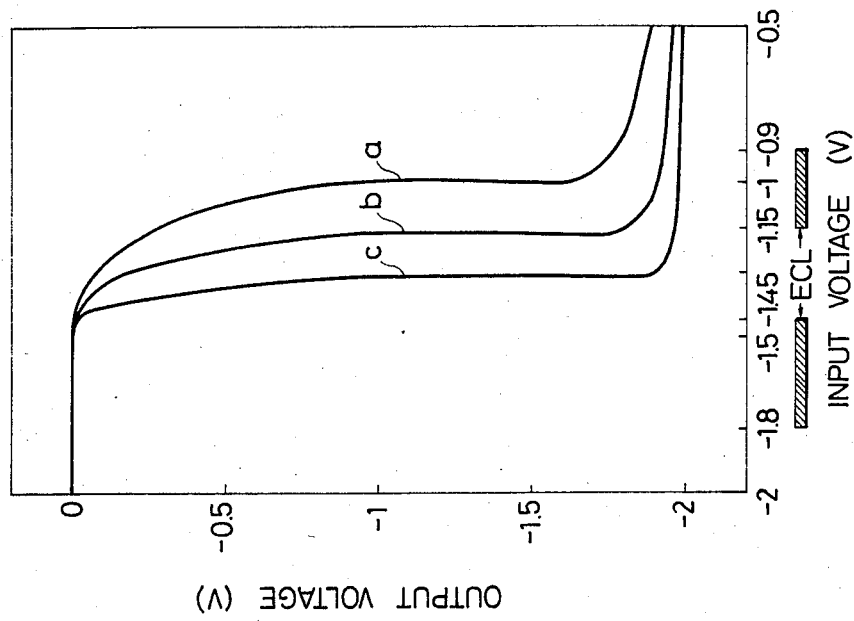
Figure 1:
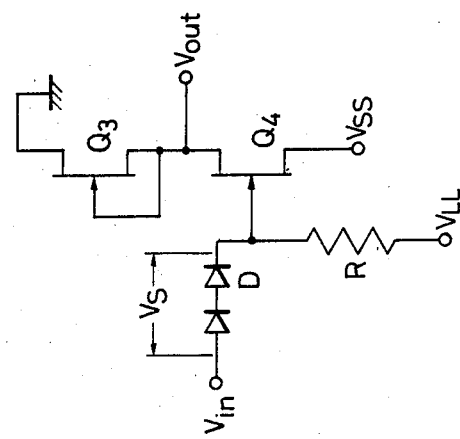
FIG. 1 is an arrangement diagram of a prior-art input buffer.

Referring to FIG. 5, symbols $Q_1$, $Q_2$, $Q_3$ and $Q_4$ denote first, second, third and fourth FETs, respectively, and symbols $D_2$ and R denote diodes and a resistor for level shifting, respectively. In addition, symbols $V_{SS}$, $V_{SS2}$ and $V_{LL}$ indicate supply voltages, and symbols $V_{in}$, $V_{out}$ and $V_{cont}$ indicate voltages at an input terminal, output terminal and control voltage input terminal, respectively. In FIG. 5, the elements $Q_3$ and $Q_4$ constitute an inverter, and $D_2$ and R a level shifting circuit, and these are the same circuits as those formed in the prior-art input buffer shown in FIG. 1. However, in addition to the inverter and level shifting circuit, FIG. 5 includes the elements $Q_1$ and $Q_2$ which constitute a source follower circuit. Moreover, unlike an ordinary source follower circuit, this source follower circuit features the fact that current flowing therethrough can be controlled with the voltage fed to the control voltage input terminal $V_{cont}$.

Here, for the sake of convenience, the level shift magnitude of the diodes $D_2$ shall be denoted by $V_S$, the source voltage of the FET $Q_1$ by $V_1$, and the gate widths of the FETs $Q_1$–$Q_4$ by $W_1$–$W_4$ respectively. In order to simplify the description, it is assumed that all the FETs are of the N-channel type and that all the threshold voltages thereof are equal and are $V_T (V_T < 0)$. It is also assumed that the supply voltage $V_{SS2}$ and the threshold voltage $V_T$ are selected so as to operate the FETs $Q_1$ and $Q_2$ constituting the source follower in their saturation regions at all times.

Now, the operation of the circuit of FIG. 5 will be described.

Since the saturation condition holds for the FETs $Q_1$ and $Q_2$ constituting the source follower, the relationship of $V_{in}$, $V_1$, $V_{cont}$ and $V_{SS2}$ becomes as follows:

$$W_1(V_{in} - V_1 - V_T)^2 = W_2(V_{cont} - V_{SS2} - V_T)^2 \quad (1)$$

$$V_1 = V_{in} - V_T\left(1 - \sqrt{\frac{W_2}{W_1}}\right) - \sqrt{\frac{W_2}{W_1}}(V_{cont} - V_{SS2})$$

That is, $V_1$ becomes a voltage obtained by converting the level of the input voltage $V_{in}$ by a certain value which is determined by $V_T$, $V_{SS2}$ and $V_{cont}$.

On the other hand, the FETs $Q_3$ and $Q_4$ constituting the inverter are both saturated when the output voltage $V_{out}$ becomes the transition logic level. Letting $V_{1TH}$ denote the value of $V_1$ at this time, namely, the input logic threshold value of the inverter, the following equation is derived:

$$W_3(-V_T)^2 = W_4(V_{1TH} - V_S - V_{SS} - V_T)^2$$

Accordingly, $V_{1TH}$ is given by the following equation:

$$V_{1TH} = V_S + V_{SS} + V_T\left(1 - \sqrt{\frac{W_3}{W_4}}\right) \quad (2)$$

Letting $V_{inTH}$ denote the value of $V_{in}$ at this time, namely, the input logic threshold value of the circuit of FIG. 5, the following is obtained from Equations (1) and (2):

$$V_{inTH} = V_{SS} + V_S + V_T\left(2 - \sqrt{\frac{W_3}{W_4}} - \sqrt{\frac{W_2}{W_1}}\right) + \quad (3)$$

$$\sqrt{\frac{W_2}{W_1}}(V_{cont} - V_{SS2})$$

An apparent from Equation (3), $V_{inTH}$ can be set at a desired value by selecting the control voltage $V_{cont}$ as follows:

$$V_{cont} = V_{SS2} + \sqrt{\frac{W_2}{W_1}}\left\{ V_{inTH} - V_{SS} - V_S - \quad (4) \right.$$

$$\left. V_T\left(2 - \sqrt{\frac{W_3}{W_4}} - \sqrt{\frac{W_2}{W_1}}\right)\right\}$$

Accordingly, in a case where $V_{SS}$, $V_{SS2}$ and $V_T$ have fluctuated; when the control voltage $V_{cont}$ is changed in accordance with Equation (4) for the preset threshold value $V_{inTH}$, a circuit whose transition logic level does not fluctuate is realized, and the object of the present invention can be accomplished. A method of generating this control voltage $V_{cont}$ will be described later.

Figure 6:
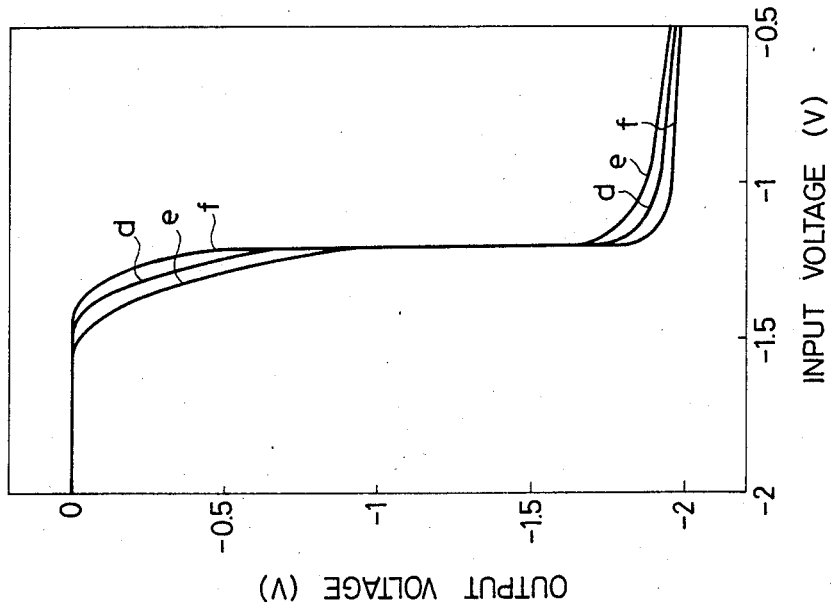
FIGS. 6 and 7 are graphs of the transfer characteristics of the circuit in FIG. 5.
Figure 7:
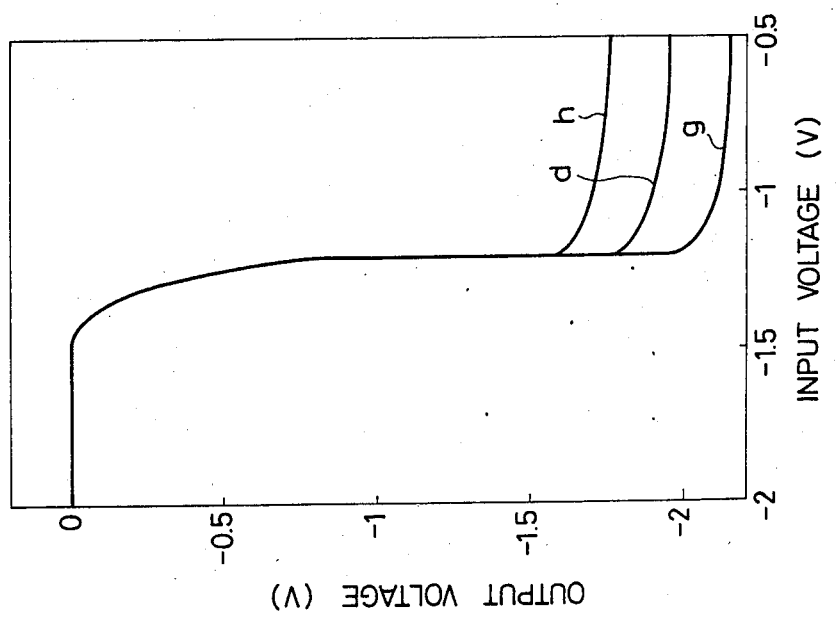

FIGS. 6 and 7 are graphs of the transfer characteristics of the circuit in FIG. 5, respectively.

In FIGS. 6 and 7, curves d indicate the transfer characteristic at design values, that is, at $V_T = -1$ V and $V_{SS} = -2$ V. Curves e and f in FIG. 6 indicate the transfer characteristics in the cases where the threshold voltage $V_T$ has become $-1.3$ V and $-0.7$ V, respectively, and curves g and h (in FIG. 7) the transfer characteristics in the cases where the supply voltage $V_{SS}$ has become $-2.2$ V and $-1.8$ V, respectively. Herein, the other constants are $W_4/W_3 = 13$, $W_2/W_1 = 3$, $V_S = 1.55$ V and $V_{inTH} = -1.2$ V. It is understood that, in any case, the output signal is substantially completely switched when the input signal has changed from $-1.45$ V to $-1.15$ V. The above corresponds to the case where all the threshold voltages $V_T$ of the FETs are assumed to be equal. However, even in a case where the threshold voltages $V_T$ are not equal, the same effect can be attained by giving $V_{cont}$ as follows:

$$V_{cont} = V_{SS2} + V_{T2} + \sqrt{\frac{W_1}{W_2}} \left( V_{inTH} - V_{SS} - V_S - V_{T4} - V_{T1} + \sqrt{\frac{W_3}{W_4}} \cdot V_{T3} \right) \quad (5)$$

where $V_{T1}$, $V_{T2}$, $V_{T3}$ and $V_{T4}$ denote the threshold voltages of the FETs $Q_1$, $Q_2$, $Q_3$ and $Q_4$, respectively.

Next, a control circuit will be described for generating the control voltage $V_{cont}$ given by Equation (4) or Equation (5).

Figure 8:
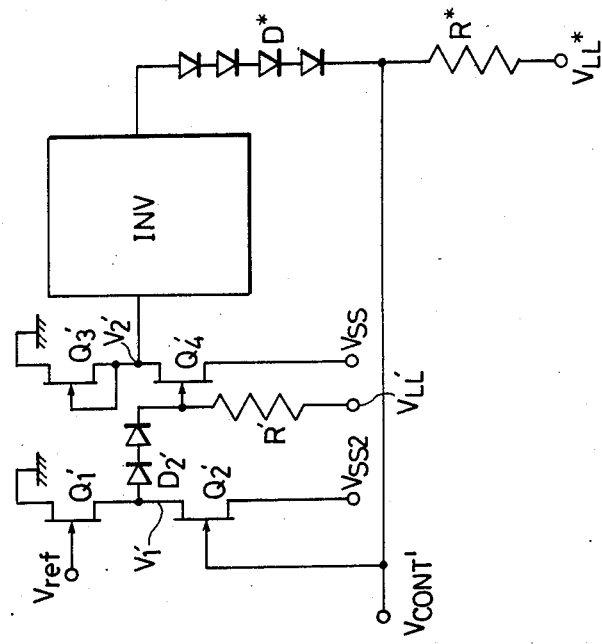
FIG. 8 is an arrangement diagram of a control circuit showing an embodiment of the present invention.

FIG. 8 is an arrangement diagram showing an embodiment of the control circuit portion of the present invention.

Referring to FIG. 8, symbols $Q_1'$, $Q_2'$, $Q_3'$ and $Q_4'$ denote first, second, third and fourth FETs, respectively, and symbols $D_2'$ and $R'$ denote diodes and a resistor for level shifting. Portions constructed of these elements are identical in arrangement to the input buffer of FIG. 5, except that the gate of the FET $Q_1'$ is supplied with a reference voltage $V_{ref}$ instead of the input voltage $V_{in}$. Symbol INV designates an inverter circuit. The input logic threshold voltage of this inverter circuit INV is designed so as to become a value close to the logic threshold voltage of the output $V_{out}$ of the circuit in FIG. 5. In addition, symbols $D^*$, $R^*$ and $V_{LL}^*$ indicate diodes, a resistor and a supply voltage, respectively, which constitute a level shifting circuit for adjusting the output level of the inverter circuit INV to the level of the control voltage $V_{cont}$. The output $V_{CONT}'$ of the level shifting circuit is connected to the gate electrode of the FET $Q_2'$ so as to apply feedback to the gate electrode. The output $V_{CONT}'$ is also a terminal for deriving the control voltage as an output of the circuit of FIG. 8, and it is connected to the control voltage terminal $V_{cont}$ of the input buffer in FIG. 5.

In order to simplify the description, it is assumed that the portions having the same arrangements as in FIG. 5 are given quite the same device constants and circuit constants as in FIG. 5, with the fixed voltage $V_{inTH}$ being applied as the reference voltage $V_{ref}$. The operation of this control circuit will be described below.

It is now supposed that the voltage $V_{CONT}'$ is equal to the potential $V_{cont}$ which fulfills the condition given by Equation (4) or Equation (5). At this time, the inverter composed of the FETs $Q_3'$ and $Q_4'$ falls into its threshold state. Thus, when a potential $V_1'$ fluctuates even if slightly, the output voltage of the inverter, namely, the input voltage $V_2'$ of the inverter INV, fluctuates greatly.

Next, it is assumed that the control voltage $V_{CONT}'$ has become somewhat higher than $V_{cont}$. Then, current flowing through the N-channel FET $Q_2'$ increases to lower $V_1'$ and to raise $V_2'$, so that the output of the inverter INV becomes close to the low level. Thus, the control voltage $V_{CONT}'$ is lowered.

That is, the control circuit of FIG. 8 forms a feedback circuit which functions in the direction of lowering $V_{CONT}'$ when this voltage has risen. Accordingly, when the control voltage $V_{CONT}'$ has conversely become somewhat lower, the output of the inverter INV functions in the direction of raising the control voltage $V_{CONT}'$. In this way, the control voltage $V_{CONT}'$ settles to a value close to $V_{cont}$, so that a control voltage which is stable against the fluctuations of the threshold voltage $V_T$ and the supply voltage $V_{SS}$ can be attained.

Figure 9:
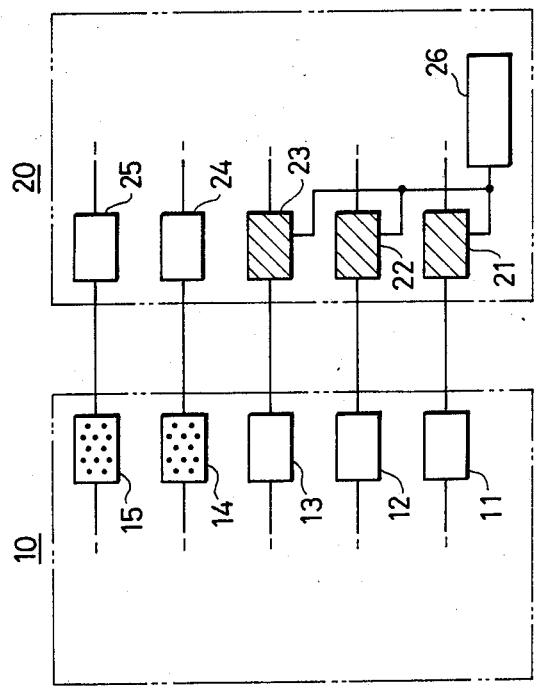
FIG. 9 is a block diagram showing an example of the connection between the input buffer of FIG. 5 and the control circuit of FIG. 8.

FIG. 9 is a block diagram showing an embodiment for connecting the control circuit of FIG. 8 to the input buffers of FIG. 5. As shown in FIG. 9, the control circuit of the present invention can also supply a control voltage to a plurality of input buffers. In the figure, numeral 10 designates an ECL LSI, and numeral 20 a FET LSI. Numerals 11, 12 and 13 indicate output buffers within the ECL LSI 10, numerals 14 and 15 input buffers within the ECL LSI 10, numerals 21, 22 and 23 the input buffers of the present invention as shown in FIG. 5, these input buffers constituting input buffers within the FET LSI 20, numerals 24 and 25 output buffers within the FET LSI 20, and numeral 26 the control circuit of the present invention as shown in FIG. 8.

It has been described that, in FIG. 8 or the control circuit, the portions having the same arrangements as in FIG. 5 or the input buffer are quite the same circuits. However, when the following conditions hold, that is, when the portions in both the figures are similar with respect to currents, these portions need not be quite the same:

$$V_{T1}, V_{T2}, V_{T3}, T_{T4}, W_1/W_2, W_3/W_4 \text{ (FIG. 5)}$$
$$= V_{T1}', V_{T2}', V_{T3}', V_{T4}', W_1'/W_2', W_3'/W_4' \text{ (FIG. 8)} \quad (6)$$

In this case, the level shift magnitudes of the diodes $D_2$ in FIG. 3 and the diodes $D_2'$ in FIG. 8 need not be equal to each other. When they are not equal, a voltage obtained by subtracting the difference of the level shift magnitudes from the voltage $V_{inTH}$ may be applied as the reference voltage $V_{ref}$. It is impossible to make the threshold voltages $V_T$ of the respective FETs exactly equal. However, with regard to the dispersion of the threshold voltages $V_T$ of FETs which are simultaneously manufactured within a single LSI chip, relative fluctuations between such FETs can be made smaller than absolute fluctuations from a design value. In addition, the input logic threshold value of the inverter INV has been set at a value close to the transition logic level of the output voltage $V_{out}$ of the circuit in FIG. 5. However, insofar as it lies between the low level and high level of the output voltage of the circuit in FIG. 5, the fluctuation of the supply voltage is amplified to change the control voltage $V_{CONT}'$, and the inverter INV operates as described above. When this condition is fulfilled, the constituent circuits for each stage of the inverter INV, the number of constituent stages of the inverter and the types of power sources to be used may be chosen in any manner desired. Further, it is sometimes the case that the number of the diodes $D^*$ changes depending upon the output levels of the inverter INV. In some cases, the output of the inverter INV is directly connected to the control voltage $V_{CONT}'$ and the gate of the FET $Q_2'$, to dispense with the diodes $D^*$, resistor $R^*$ and supply voltage $V_{LL}^*$, or the sense of the diodes $D^*$ becomes opposite to that shown.

In the circuits of FIGS. 5 and 8, the supply voltages $V_{SS}$ and $V_{SS2}$ or the supply voltages $V_{LL}$ and $V_{LL}'$, $V_{LL}^*$ may well be equalized.

FIGS. 10, 11, 12, 13, 14, 15, 16 and 17 are arrangement diagrams of input buffers which each represent another embodiment of the present invention.

Figure 10:
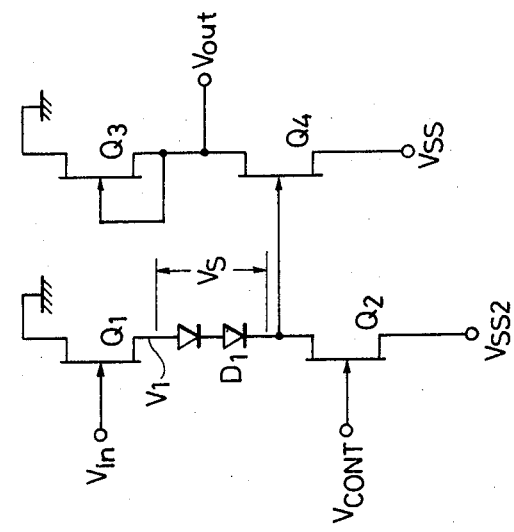
FIGS. 10, 11, 12, 13, 14, 15, 16 and 17 are arrangement diagrams of the input buffers which each show another embodiment of the present invention.
Figure 12:
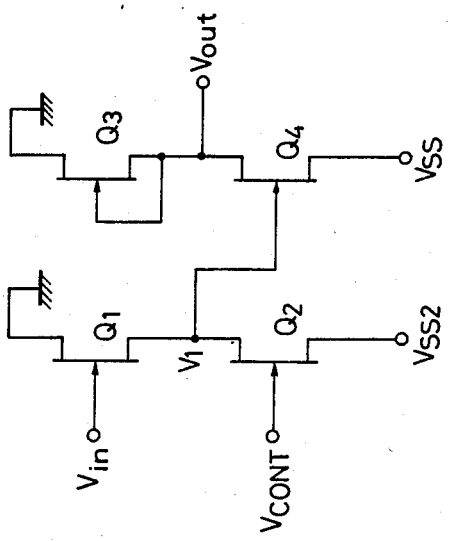
Figure 11:
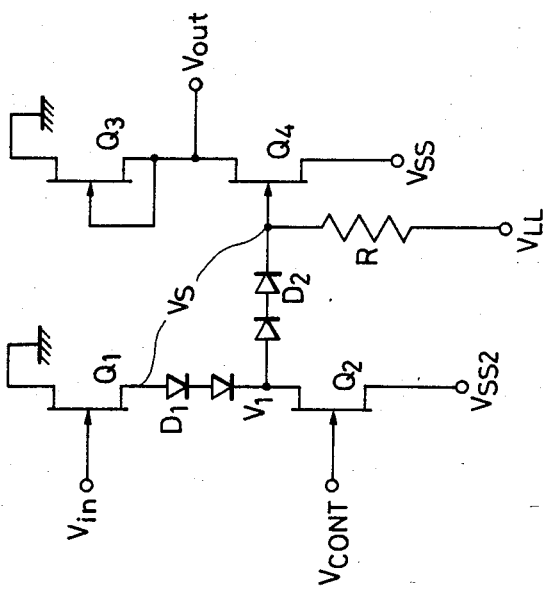
Figure 14:
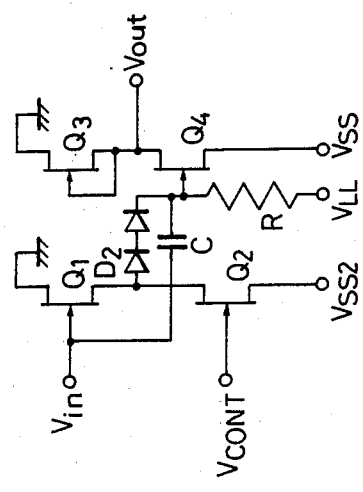
Figure 15:
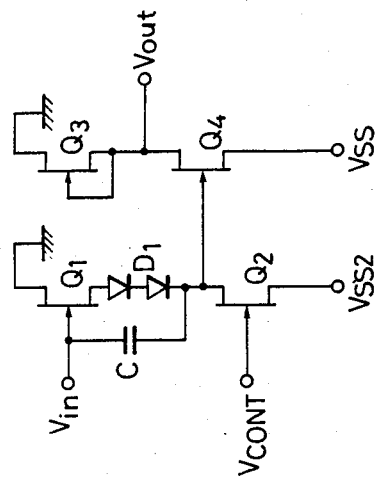
Figure 13:
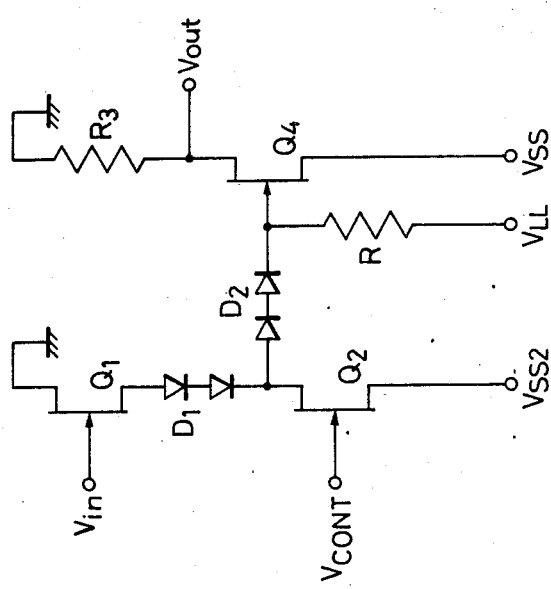

The embodiment of FIG. 10 is such that, in the arrangement of FIG. 5, the level shifting circuit composed of the diodes $D_2$, resistor R and voltage source $V_{LL}$ is replaced with diodes $D_1$ connected in series between the FETs $Q_1$ and $Q_2$, so as to derive the output of the source follower circuit from between the diodes $D_1$ and the FET $Q_2$ and to supply it to the inverter circuit of the succeeding stage. The embodiment of FIG. 11 is such that, in the arrangement of FIG. 5, diodes $D_1$ are further connected in series between the FETs $Q_1$ and $Q_2$, so as to derive the output of the source follower circuit from between the diodes $D_1$ and FET $Q_2$ and to supply it to the inverter circuit of the succeeding stage through the diodes $D_2$. The embodiment of FIG. 12 is such that, in the arrangement of FIG. 5, the level shifting circuit composed of the diodes $D_2$, resistor R and voltage source $V_{LL}$ is omitted so as to directly supply the inverter circuit of the succeeding stage with the output of the source follower circuit derived from between the FETs $Q_1$ and $Q_2$. The embodiment of FIG. 13 is such that, in the arrangement of FIG. 11, the FET $Q_3$ is replaced with a resistor $R_3$. The embodiments of FIGS. 14, 15, 16 and 17 are such that, in the arrangement of FIGS. 5, 10, 11 and 12, a coupling capacitor C is connected between the input end $V_{in}$ (the gate electrode of the FET $Q_1$) of the source follower circuit and the input end (the gate electrode of the FET $Q_4$) of the inverter circuit, respectively.

The effect of the present invention is similarly achieved even when the circuit of FIG. 5 or the same constituent portions in FIG. 8 as in FIG. 5 is/are replaced with the circuit shown in FIGS. 10, 11, 12, 13, 14, 15, 16 or 17. The circuit to be used as the input buffer, and the circuit to be used as a part of the control circuit can be selected from among FIGS. 5, 8, 10, 11, 12, 13, 14, 15, 16 and 17 independently of each other. At this time, the relations to be met by the FET device constants and circuit constants of the circuit for use as the input buffer and the circuit for use as a part of the control circuit are the same as the relations of Equation (6) mentioned before:

$V_{T1}, V_{T2}, V_{T3}, V_{T4}, W_1/W_2, W_3/W_4$ (input buffer)

$= V_{T1}', V_{T2}', V_{T3}', V_{T4}', W_1'/W_2', W_3'/W_4'$ (control circuit) (7)

In this case, the description previously given still holds true by considering the voltage drop $V_S$ to be the level shift magnitude of the diodes $D_1$ for the circuit of FIG. 10, to be the sum of the level shift magnitudes of the diodes $D_1$ and $D_2$ for the circuit of FIG. 11, ahnd to be 0 V for the circuit of FIG. 12. It is a matter of course that the niumber of the diodes $D_1$ or $D_2$ in FIGS. 5, 10, 11, 14, 15 or 16 may be any number of at least one.

The effect of the present invention applies even when the resistor $R_3$ is substituted for the FET $Q_3$ in FIGS. 5, 10, 11 or 12. While the circuit of FIG. 13 is the example of such substitution for the circuit of FIG. 11, similar substitutions for the circuits of FIGS. 5, 10 and 12 are possible as well as for the control circuit for FIG. 8. Thus, the substitution can be performed for both the input buffer and the control circuit, and the conditions of Equation (7) become as follows:

$V_{T1}, V_{T2}, V_{T4}, W_1/W_2, R_3 \times W_4$ (input buffer)

$= V_{T1}', V_{T2}', V_{T4}', W_1'/W_2', R_3' \times W_4'$ (control circuit) (8)

In a case where the circuit without any substitution has the following conditions:

$$V_{T1} = V_{T2} = V_{T3} = V_{T4} \qquad (9)$$

and $$\sqrt{W_3/W_4} + \sqrt{W_2/W_1} = 2$$

the control voltage $V_{cont}$ given by Equation (4) becomes independent of the threshold voltage $V_T$, as follows:

$$V_{cont} = V_{SS2} + \sqrt{\frac{W_1}{W_2}} \; (V_{inTH} - V_{SS} - V_S) \qquad (10)$$

Since the four FETs $Q_1$, $Q_2$, $Q_3$ and $Q_4$ in one input buffer can be brought closer than the distance between the input buffer and the control circuit, the dispersion of the threshold voltages $V_T$ can be made still smaller than in the case of the conditions of Equation (6). Accordingly, a more remarkable effect can be expected.

Figure 18:
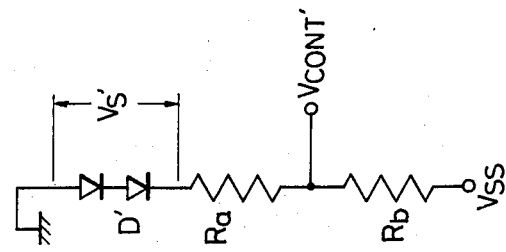
FIG. 18 is an arrangement diagram of a control circuit showing another embodiment of the present invention.
Figure 16:
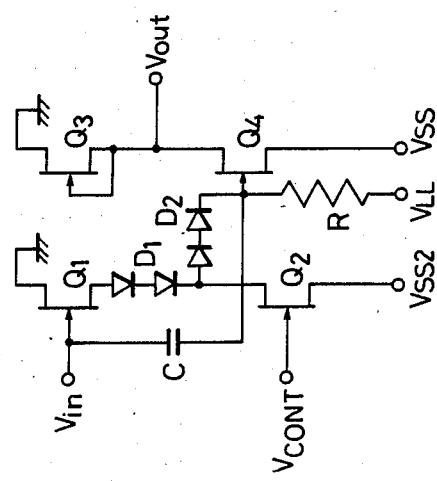
Figure 17:
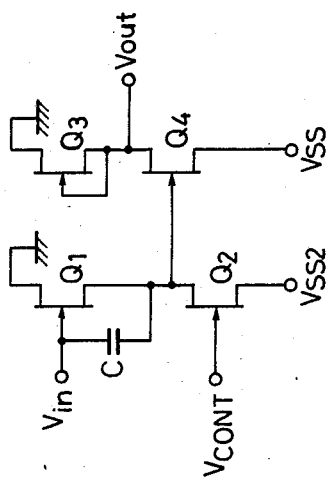

FIG. 18 is an arrangement diagram showing another embodiment of the control circuit portion of the present invention.

When the supply voltages $V_{SS}$ and $V_{SS2}$ are equal and fluctuate only by a small amount, it is possible to employ simple arrangement shown in FIG. 18 as the control circuit. In the FIG. 18 arrangement, the level shifting diodes $D'$ and resistors $R_a$ and $R_b$ are connected in series so as to derive the control voltage $V_{CONT}'$ from between the resistors $R_a$ and $R_b$.

In FIG. 18, in a case where the ratio of the resistances $R_a$ and $R_b$ is set so that $R_a/R_b = \sqrt{W_2/W_1} - 1$ may hold and where the number of the diodes $D'$ and the values of the resistances $R_a$ and $R_b$ are determined so that the level shift magnitude $V_S'$ of the diodes $D'$ may become equal to $(V_S - V_{inTH})$ in Equation (10), the control voltage $V_{CONT}'$ becomes as follows:

$$V_{CONT}' = \left(1 - \sqrt{\frac{W_1}{W_2}}\right) V_{SS} + \sqrt{\frac{W_1}{W_2}} \; (V_{inTH} - V_S) \qquad (11)$$

Equation (11) agrees with $V_{cont}$ resulting when $V_{SS2} = V_{SS}$ is assumed in Equation (10).

Any of the level shifting resistors R use in the various embodiments, except the simple control circuit shown in FIG. 18, can be replaced with any desired current limiter. One example is a FET whose source electrode and gate electrode are connected in common.

Further, although all the FETs used in the respective embodiments have been of the N-channel, they all may well be P-channel FETs, with the polarities of the diodes and the supply voltages reversed.

When, as shown in FIGS. 14, 15, 16 or 17, the coupling capacitor C is connected between the input terminal $V_{in}$ and the gate electrode of the FET $Q_4$, an increase in the delay time can be reduced. Needless to say, the connection of such a coupling capacitor C is also applicable to circuits in which the FET $Q_3$ is replaced with the resistor as shown in FIG. 13.

With some constants selected, it is sometimes a concern that the control circuit will oscillate. For avoiding this drawback, it is effective to connect a capacitor between the terminal of the control voltage $V_{CONT}'$ and the power source.

While, in the embodiments described, the case of receiving an input signal of the ECL level has been given, a signal of any desired level can be received by altering the voltage to be applied as the reference voltage $V_{ref}$ of the control circuit.

As described above, the present invention can realize an input buffer less susceptible to manufacturing dispersions or supply voltage fluctuations, without increasing power consumption or delay time. Therefore, the invention is very effective when applied to any sort of FET integrated circuit such as GaAs MESFETs or Si MOS devices.

We claim:

1. An input buffer comprising a source follower circuit having a logic threshold level which is subject to undesired fluctuations in logic threshold level which includes first and second FETs of an identical conductivity type connected in series, and in which a gate of said first FET is connected to a circuit input for receiving an input signal, and a FET inverter circuit, which receives an output of said source follower circuit derived from between said first and second FETs wherein the logic threshold level of said source follower circuit is controlled by a voltage which is produced by a means for producing a compensating voltage which varies in a manner opposite to the undesired fluctuations in logic threshold level, that is applied to a gate of said second FET in said source follower circuit to cancel said undesired fluctuations.

2. An input buffer according to claim 1, wherein said source follower circuit includes at least one first diode which is connected in series between said first and second FETs, and the output of said source follower circuit is derived from between said second FET and said first diode.

3. An input buffer according to claim 1, wherein said FET inverter circuit includes a first load element and a third FET which are connected in series, wherein a gate of said third FET receives the output of said source follower circuit, and wherein an output of said inverter is provided from between said first load element and said third FET.

4. An input buffer according to claim 3, wherein said first load element is a fourth FET those source and gate are connected in common.

5. An input buffer according to claim 1, further comprising a capacitor which is connected between the input end of said source follower circuit and an input end of said FET inverter.

6. An input buffer according to claim 1, wherein said means for producing a compensating voltage includes a first circuit which receives a predetermined reference voltage and which is equivalent to said source follower circuit, a second circuit which receives an output of said first circuit and which is equivalent to said FET inverter circuit, and an inverter circuit which receives an output of said second circuit; an output of said inverter circuit being fed back to said first circuit and being supplied to the gate of said second FET of said source follower circuit.

7. An input buffer according to claim 6, wherein the output of said inverter circuit in said said means for producing a compensating voltage is derived through at least one diode.

8. An input buffer according to claim 6, wherein said second circuit receives the output of said first circuit through at least one diode.

9. An input buffer according to claim 4, wherein the respective FETs which constitute said source follower circuit and said FET inverter circuit have equal threshold voltages, and wherein a sum between a square root of a gate width ratio of said first and second FETs of said source follower circuit and a square root of an inverse number of a gate width ratio of said third and fourth FETs of said FET inverter circuit is approximately 2.

10. An input buffer according to claim 6, wherein said means for producing a compensating voltage comprises means for adjusting the voltage supplied to the gate of said second FET so that an output of said FET inverter circuit will completely switch from a first predetermined level to a second predetermined level in response to input signals applied to said gate of said first FET falling within a predetermined voltage range.

11. An input buffer according to claim 10, wherein said input signals applied to said gate of said first FET are derived from an ECL LSI circuit, and wherein said output of said FET inverter circuit is coupled to a FET LSI circuit.

12. An input buffer according to claim 11, wherein said predetermined voltage range for said input signals applied to said gate of said first FET for completely switching said output of said FET inverter circuit is $-1.15$ V to $-1.45$ V.

13. An input buffer comprising a source follower circuit which includes first and second FETs of an identical conductivity type connected in series, and in which a gate of said first FET is connected to a circuit input for receiving an input signal, and a FET inverter circuit which receives an output of said source follower circuit derived from between said first and second FETs, through at least one diode, a logic threshold level of said source follower circuit being controlled by a voltage which is supplied to a gate of said second FET in said source follower circuit.

14. An input buffer comprising a source follower circuit which includes first and second FETs of an identical conductivity type connected in series, and in which a gate of said first FET is connected to a circuit input for receiving an input signal, and a FET inverter circuit which receives an output of said source follower circuit, said source follower circuit including at least one first diode which is connected in series between said first and second FETs, and the output of said source follower circuit being derived from between said second FET and said first diode and wherein said FET inverter circuit receives the output of said source follower circuit through at least one second diode, a logic threshold level of said source follower circuit being controlled by a voltage which is supplied to a gate of said second FET in said source follower circuit.

* * * * *